(12) United States Patent
Kimura et al.

(10) Patent No.: US 8,507,171 B2
(45) Date of Patent: Aug. 13, 2013

(54) POSITIVE PHOTOSENSITIVE COMPOSITION

(75) Inventors: Yuki Kimura, Ichihara (JP); Tomohiro Etou, Ichihara (JP); Manabu Kondo, Ichihara (JP)

(73) Assignee: JNC Corporation, Tokyo (JP)

( * ) Notice: Subject to any disclaimer, the term of this patent is extended or adjusted under 35 U.S.C. 154(b) by 364 days.

(21) Appl. No.: 12/835,581

(22) Filed: Jul. 13, 2010

(65) Prior Publication Data
US 2011/0008589 A1 Jan. 13, 2011

(30) Foreign Application Priority Data

Jul. 13, 2009 (JP) ................. 2009-164417

(51) Int. Cl.
*G03F 7/023* (2006.01)

(52) U.S. Cl.
USPC ........... 430/191; 430/192; 430/193; 524/266; 428/447

(58) Field of Classification Search
USPC .......... 430/191, 192, 193; 428/447; 524/266
See application file for complete search history.

(56) References Cited

U.S. PATENT DOCUMENTS

| 4,384,037 | A | 5/1983 | Hosaka et al. | |
| 5,362,597 | A | 11/1994 | Sano et al. | |
| 7,374,856 | B2 * | 5/2008 | Suwa et al. | 430/169 |
| 7,524,917 | B2 * | 4/2009 | Ootake et al. | 528/33 |
| 2006/0115766 | A1 | 6/2006 | Suwa et al. | |
| 2010/0129618 | A1 | 5/2010 | Suwa | |

FOREIGN PATENT DOCUMENTS

| JP | 51-034711 | 3/1976 |
| JP | 56-122031 | 9/1981 |
| JP | 05-165214 | 7/1993 |
| JP | 2006-178436 | 7/2006 |
| JP | 2009-015285 | 1/2009 |

* cited by examiner

*Primary Examiner* — Margaret Moore
(74) *Attorney, Agent, or Firm* — Hogan Lovells US LLP

(57) ABSTRACT

The present invention provides a positive photosensitive composition containing a specific tetrafunctional silsesquioxane compound (A), a siloxane polymer (B) formed of multiple kinds of alkoxysilane compounds having different numbers of alkoxyl groups, a 1,2-quinone diazide compound (C), and a solvent (D) in order to provide a positive photosensitive composition useful for forming a film on which a pattern is formed, the film being excellent in high thermal resistance, high transparency, crack resistance, adhesiveness with a ground, and the like, and being obtained by performing development with an alkali aqueous solution.

7 Claims, No Drawings

POSITIVE PHOTOSENSITIVE COMPOSITION

TECHNICAL FIELD

The present invention relates to a positive photosensitive composition that can be utilized in, for example, a resist field.

BACKGROUND ART

Patterned transparent films have been used in many parts of display devices such as spacers, insulating films, and protective films, and many positive photosensitive compositions have heretofore been proposed for these applications (for example, see JP Sho 51-34711 A, JP Sho 56-122031 A, and JP Hei 05-165214 A).

In general, electronic parts, such as thin-film transistor type liquid crystal display devices and solid-state image sensing devices are provided with insulating films for insulation between electric wirings arranged in layers. A positive photosensitive composition that allows the formation of an insulating film having a desired pattern by a small number of steps has been widely used as a material that forms the insulating film. The positive photosensitive composition is required to have a wide process margin in the process of forming an insulating film. Further, an insulating film or a display device using the positive photosensitive composition may be in contact with a solvent, an acid, an alkali solution, or the like by, for example, dipping and treated with heat in a post-production process.

In recent years, there also exists an application of further forming an inorganic film on a transparent film formed (patterned transparent film) under high temperatures. In this case, the inorganic film to be formed is formed by means such as chemical vapor deposition or sputtering. In order to obtain a film of good quality by one of those film formation methods, high temperatures of 300° C. or more are required in a film formation process in some cases. That is, the transparent film (patterned transparent film) serving as a ground for the inorganic film is also exposed to high temperatures in some cases. When the transparent film (patterned transparent film) serving as a ground for the inorganic film has insufficient thermal resistance, desorption gas is produced owing to thermal decomposition of the transparent film (patterned transparent film) during a high temperature process, and the inorganic film of good quality is not obtained because of the influence of the desorption gas. In addition, thermal deterioration causes coloring in the transparent film (patterned transparent film), resulting in difficulty in the use of the resultant film for transparency applications. Because of those reasons, a positive photosensitive composition having high thermal resistance to a temperature of 300° C. or more has been demanded.

Some proposals have been made as positive photosensitive compositions provided for those applications. For example, there are proposed a material containing a siloxane polymer and a naphthoquinone-based photosensitizing agent, and a material in which a siloxane polymer, an imide compound, and a naphthoquinone-based photosensitizing agent are mixed (see, for example, JP 2006-178436 A and JP 2009-15285 A). Films made from those materials each had a problem in that fully satisfying crack resistance, high transparency (transmittance and transparence), and other required characteristics was difficult in a film formation process under a condition of high temperatures of 300° C. or more.

SUMMARY OF THE INVENTION

Problem to be Solved by the Invention

The present invention provides a positive photosensitive composition from which a transparent film on which a pattern is formed (patterned transparent film) can be formed, the film having crack resistance even at 300° C. or more and being excellent in transparency.

Means for Solving the Problem

The inventors of the present invention have found that the problem can be solved by using, in a positive photosensitive composition containing a silicon compound, a 1,2-quinone diazide compound, and a solvent, a specific silsesquioxane and a specific siloxane polymer as the silicon compound, and have completed the present invention based on the finding. The present invention includes the following items.

[1] A photosensitive composition, comprising: a compound (A) represented by the following general formula (I); a siloxane polymer (B), which has alkali solubility and is synthesized by hydrolytic condensation of materials including two or more kinds of alkoxysilane compounds having different numbers of alkoxyl groups; a 1,2-quinone diazide compound (C); and a solvent (D) for dissolving the above-mentioned (A) to (C).

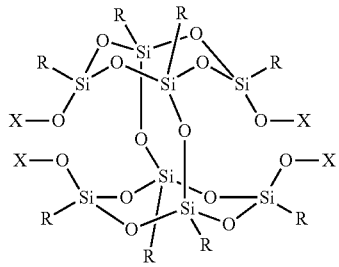

(I)

In the general formula (I), R's independently represent hydrogen, an alkyl group having 1 to 45 carbon atoms, a cycloalkyl group having 4 to 8 carbon atoms, or a substituted or unsubstituted aryl group having 6 to 10 carbon atoms; X's independently represent hydrogen, —Si (CH$_3$)$_2$H, —Si (CH$_3$)$_3$, —Si(CH$_3$)$_2$(CH$_2$)$_3$—OOCC(CH$_3$)=CH$_2$, —Si (CH$_3$)$_2$(CH$_2$)$_3$COOH, or a group represented by the following formula (II). In each of the alkyl group having 1 to 45 carbon atoms represented by R and the cycloalkyl group having 4 to 8 carbon atoms represented by R, any hydrogen may be replaced by fluorine, and any —CH$_2$— may be replaced by —O— or a cycloalkylene group having 5 to 18 carbon atoms as long as the —CH$_2$— is unadjacent to another —CH$_2$—; and in a benzene ring of the substituted aryl group represented by R, any hydrogen bonded to the benzene ring may be independently replaced by an alkyl group having 1 to 10 carbon atoms or a halogen.

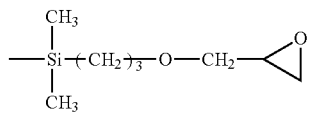

(II)

[2] The photosensitive composition described in Item [1], in which the compound (A) represented by the general formula (I) is contained at a ratio of 1 to 50 parts by weight with respect to 100 parts by weight of the siloxane polymer (B).

[3] The photosensitive composition described in Item [1] or [2], in which the siloxane polymer (B) has a weight average molecular weight of 500 to 100,000 in terms of polystyrene.

[4] A patterned transparent film, which is formed by exposure to light, development, and baking of a coated film of the photosensitive composition described in any one of Items [1] to [3].

[5] A display device comprising the patterned transparent film described in Item [4].

[6] The display device described in Item [5], comprising the patterned transparent film as an insulating film.

Effect of the Invention

The present invention can provide the positive photosensitive composition from which the patterned transparent film having crack resistance even when being exposed to an environment at 300 to 350° C. during baking and being excellent in transparency can be formed. This is because the positive photosensitive composition comprises the above-mentioned specific silicon compound (A) and silicon compound (B), the 1,2-quinone diazide compound (C), and the solvent (D).

MODES FOR CARRYING OUT THE INVENTION

A photosensitive composition of the present invention contains a compound (A) represented by the following general formula (I), a siloxane polymer (B) synthesized by hydrolytic condensation of materials including two or more kinds of alkoxysilane compounds having different numbers of alkoxyl groups, a 1,2-quinone diazide compound (C), and a solvent (D) for dissolving the above-mentioned (A) to (C).

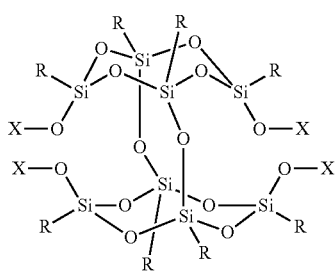

(1) Compound (A) Represented by General Formula (I)

In the general formula (I), R's independently represent hydrogen, an alkyl group having 1 to 45 carbon atoms, a cycloalkyl group having 4 to 8 carbon atoms, or a substituted or unsubstituted aryl group having 6 to 10 carbon atoms. In each of the alkyl group having 1 to 45 carbon atoms represented by R and the cycloalkyl group having 4 to 8 carbon atoms represented by R, any hydrogen may be replaced by fluorine, and any —$CH_2$— may be replaced by —O— (however, —O— is not adjacent to another —O—), and in the alkyl group, —$CH_2$— may be replaced by a cycloalkylene group having 5 to 18 carbon atoms.

The alkyl group represented by R is preferably a methyl group in terms of thermal resistance and transparency. In addition, the cycloalkyl group represented by R is preferably a cyclohexyl group in terms of thermal resistance and transparency. Further, the aryl group represented by R is preferably a phenyl group in terms of thermal resistance and transparency.

In addition, in the benzene ring of the substituted aryl group represented by R, any hydrogen bonded to the benzene ring may be independently replaced by an alkyl group having 1 to 10 carbon atoms or a halogen. In addition, substituents in the substituted aryl group are not particularly limited, but are preferably a methyl group and fluorine in terms of thermal resistance and transparency. Examples of the substituted aryl group include a 4-methylphenyl group, a 4-fluorophenyl group, a 3,4-difluorophenyl group, and a 3,4,5-trifluorophenyl group.

Preferred examples of R include a methyl group and a phenyl group.

In addition, in the general formula (I), X's independently represent hydrogen, —$Si(CH_3)_2H$, —$Si(CH_3)_3$, —$Si(CH_3)_2(CH_2)_3$—$OOCC(CH_3)$=$CH_2$, —$Si(CH_3)_2(CH_2)_3COOH$, or a group represented by the following formula (II).

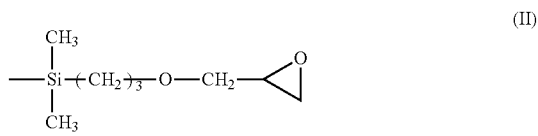

One kind of the compound (A) represented by the general formula (I) may be included, or two or more kinds may be included. For the compound (A) represented by the general formula (I), the kinds and number of functional groups can be selected depending on purposes, and the optimal compound can be selected depending on the required characteristics. Further, it is also possible to add the compound (A) represented by the general formula (I) to the composition, or it is also possible to incorporate the compound (A) represented by the general formula (I) into part of the structure of the siloxane polymer (B) after causing the compound to react with the siloxane polymer (B).

The compound (A) represented by the general formula (I) can be easily synthesized according to a method described in WO 04/024741 A1 or JP 2006-182650 A.

The structure of the compound (A) represented by the general formula (I) is controlled at a molecular level, and the compound (A) is excellent in compatibility with other components. Thus, when a transparent film (patterned transparent film) is formed from the photosensitive composition, the transparent film is excellent in transparency (transmittance and transparence) and has no surface roughness. Thus, films of uniform quality can be obtained.

The content of the compound (A) in the photosensitive composition of the present invention is, with respect to 100 parts by weight of the siloxane polymer (B), preferably 1 part by weight or more, more preferably 5 parts by weight or more, or still more preferably 10 parts by weight or more, in terms of sufficient expression of crack resistance. In addition, the content of the compound (A) is preferably 50 parts by weight or less, more preferably 40 parts by weight or less, or still more preferably 30 parts by weight or less in terms of sufficient expression of various characteristics generally required such as developing property.

(2) Siloxane Polymer (B)

The siloxane polymer (B) is a compound which is synthesized by hydrolytic condensation of materials including two or more kinds of alkoxysilane compounds having different numbers of alkoxyl groups. One kind of the siloxane polymer (B) may be used, or two or more kinds may be used. A product provided by any other reaction may be used so long as the product has a structure of the compound synthesized by hydrolytic condensation. The above-mentioned siloxane polymer (B) can be synthesized by using at least two kinds or more kinds of alkoxysilane compounds having different numbers of alkoxyl groups, the alkoxysilane compounds being selected from alkoxysilane compounds each having 1 to 4 or more alkoxyl groups. The alkali solubility of the siloxane polymer (B) needs to be controlled so that the siloxane polymer (B) may have a desired dissolving rate with respect to an alkali. The alkali solubility of the siloxane polymer (B) can be adjusted by controlling the number of alkoxyl groups in the siloxane polymer (B) and the molecular weight of the siloxane polymer (B). The number of alkoxyl groups and molecular weight of the siloxane polymer (B) can be adjusted by using two or more kinds of alkoxysilane compounds having different numbers of alkoxyl groups as materials. Besides, in addition to the two or more kinds of alkoxysilane compounds, it is also possible to use a silanol compound or a siloxane compound such as disiloxane or tetrasiloxane. Hereinafter, the above-mentioned compounds that can be used for hydrolytic condensation are referred to as alkoxysilane compounds.

Specific examples of the alkoxysilane compounds include tris(3-(trimethoxysilyl)propyl)isocyanurate as a penta- or more functional alkoxysilane compound having 5 or more alkoxyl groups. In addition, as a tetrafunctional alkoxysilane compound having 4 alkoxyl groups, there are exemplified tetrabutyl orthosilicate, tetrapropyl orthosilicate, tetraisopropyl orthosilicate, tetraethyl orthosilicate, and tetramethyl orthosilicate. In addition, as a trifunctional alkoxysilane compound having 3 alkoxyl groups, there are exemplified (3-bromopropyl)trimethoxysilane, (3-mercaptopropyl)triethoxysilane, (3-mercaptopropyl)trimethoxysilane, chloromethyltriethoxysilane, 1-[3-(trimethoxysilyl)propyl] urea, 2-(3,4-epoxycyclohexyl)ethyltrimethoxysilane, 2-cyanoethyltriethoxysilane, 3-(2-aminoethylamino)propyltriethoxysilane, 3-(2-aminoethylamino)propyltrimethoxysilane, 3-(triethoxysilyl)propyl isocyanate, 3-(trimethoxysilyl)propyl acrylate, 3-(trimethoxysilyl)propyl methacrylate, 3-aminopropyltriethoxysilane, 3-aminopropyltrimethoxysilane, 3-chloropropyltriethoxysilane, 3-glycidyloxypropyltrimethoxysilane, 3-trimethoxysilylpropylchloride, 3-ureidopropyltriethoxysilane, 3-[tris(trimethylsilyloxy)silyl]propyl methacrylate, allyltriethoxysilane, allyltrimethoxysilane, triethoxyvinylsilane, trimethoxyvinylsilane, benzyltriethoxysilane, cyclohexyltrimethoxysilane, dodecyltrimethoxysilane, ethyltrimethoxysilane, hexyltriethoxysilane, hexyltrimethoxysilane, octyltriethoxysilane, octadecyltriethoxysilane, octadecyltrimethoxysilane, pentyltriethoxysilane, triethoxyphenylsilane, trimethoxyphenylsilane, trimethoxy(p-tolyl)silane, triethoxymethylsilane, [bicyclo[2.2.1]hept-5-en-2-yl]triethoxysilane, triethoxy-1H,1H,2H,2H-tridecafluoro-n-octylsilane, triethoxyethylsilane, triethoxyfluorosilane, triethoxysilane, trimethoxysilane, and trimethoxy[3-(phenylamino)propyl] silane.

In addition, as a difunctional alkoxysilane compound having 2 alkoxyl groups, there are exemplified diethoxydimethylsilane, dimethoxydimethylsilane, 3-(2-aminoethylamino) propyldimethoxymethylsilane, 3-aminopropyldiethoxymethylsilane, 3-chloropropyldimethoxymethylsilane, 3-glycidyloxypropyldimethoxymethylsilane, 3-mercaptopropyldimethoxymethylsilane, cyclohexyldimethoxymethylsilane, diethoxy(3-glycidyloxypropyl)methylsilane, diethoxymethylphenylsilane, dimethoxymethylphenylsilane, diethoxydiphenylsilane, dimethoxydiphenylsilane, diethoxymethylsilane, dimethoxymethylsilane, diethoxymethylvinylsilane, dimethoxymethylvinylsilane, and dimethoxydi-p-tolylsilane. In addition, as a monofunctional alkoxysilane compound having one alkoxyl group, there are exemplified ethoxytriethylsilane, methoxytrimethylsilane, and trimethylethoxysilane.

Further, as the silanol compound, there are exemplified diphenylsilanediol, diethyl(isopropyl)silanol, triethylsilanol, and triphenylsilanol. In addition, as the siloxane compound, there are exemplified hexamethyldisiloxane and octamethylcyclotetrasiloxane.

The siloxane polymer using any of those alkoxysilane compounds has high transparency at its initial stage, and the transparency rarely deteriorates owing to baking at high temperatures. The siloxane polymer is highly dissolved in an alkali aqueous solution during development, that is, has high developing property, and hence a patterned transparent film is easily obtained. Moreover, the patterned transparent film obtained from the siloxane polymer exhibits high solvent resistance, high water resistance, high acid resistance, high alkali resistance, and high thermal resistance, and has high adhesiveness with a ground.

Only two kinds of alkoxysilane compounds having different numbers of functional groups may be used, or two or more kinds of those alkoxysilane compounds may be used in mixture by selecting from the above-mentioned alkoxysilane compounds.

Of the above-mentioned specific examples, tetraethyl orthosilicate, tetramethyl orthosilicate, allyltriethoxysilane, allyltrimethoxysilane, triethoxyvinylsilane, trimethoxyvinylsilane, triethoxyphenylsilane, trimethoxyphenylsilane, triethoxysilane, trimethoxysilane, diethoxydimethylsilane, dimethoxydimethylsilane, diphenyldiethoxysilane, ethoxytrimethylsilane, methoxytrimethylsilane, and diphenylsilanediol are each easily obtained and preferred in terms of improvements in solvent resistance, water resistance, acid resistance, alkali resistance, thermal resistance, and transparency of the patterned transparent film obtained.

The siloxane polymer (B) has alkali solubility. In the present invention, the term "alkali solubility" refers to a feature that when a solution of the siloxane polymer (B) is applied on a substrate by spin-coating, followed by heating at 100° C. for 2 minutes, to thereby form a film having a thickness of 0.01 to 100 µm, and then the film is immersed in a 2.38 wt % aqueous solution of tetramethylammonium hydroxide at 25° C. for 5 minutes and is rinsed with pure water, the film is dissolved in an alkali to such an extent that the film does not remain.

The alkali solubility of the siloxane polymer (B) can be adjusted by controlling the kinds of the alkoxysilane compounds, and the hydrophobic property and number of the groups comprised in the alkoxysilane compounds. For example, the alkali solubility of the siloxane polymer (B) can be enhanced by using a larger amount of an alkoxysilane compound having 3 or more alkoxyl groups (tri- or more functional) as a material. On the other hand, the alkali solubility of the siloxane polymer (B) can be suppressed by using groups having high hydrophobic property as groups except the alkoxyl groups in the alkoxysilane compounds. Thus, the alkali solubility of the siloxane polymer (B) can be further suppressed by incorporating such hydrophobic groups in a larger amount into the alkoxysilane compounds. Examples of those hydrophobic groups include methyl, ethyl, propyl, butyl, pentyl, hexyl, cyclohexyl, and phenyl groups.

The alkoxysilane compounds preferably include difunctional or monofunctional alkoxysilane compounds and tri- or more functional alkoxysilane compounds in terms of control of the molecular weight of the siloxane polymer and in terms of the sufficient expression of the alkali solubility of the siloxane polymer (B). Further, if difunctional alkoxysilane compounds are used, when a coated film is exposed to light and is developed to provide a pattern, the difference between the solubility of an exposed portion and the solubility of an unexposed portion becomes larger, and hence the sensitivity can be enhanced.

The content of the difunctional or monofunctional alkoxysilane compounds with respect to the total amount of the alkoxysilane compounds in the materials of the siloxane polymer (B) is preferably 3 to 15 wt %, more preferably 5 to 15 wt %, or still more preferably 7 to 15 wt % in terms of suppression of the molecular weight of the siloxane polymer and an improvement in the sensitivity at the time of patterning.

The content of the tri- or more functional alkoxysilane compounds with respect to the total amount of the alkoxysilane compounds in the materials of the siloxane polymer (B) is preferably 80 to 97 wt %, or more preferably 85 to 97 wt % in terms of the sufficient expression of the alkali solubility of the siloxane polymer (B).

The content of monofunctional alkoxysilane compounds with respect to the total amount of the alkoxysilane compounds in the materials of the siloxane polymer (B) is preferably 0.1 to 30 wt %, more preferably 1 to 20 wt %, or still more preferably 3 to 10 wt % in terms of suppression of the molecular weight of the siloxane polymer.

Further, the content of difunctional alkoxysilane compounds with respect to the total amount of the alkoxysilane compounds in the materials of the siloxane polymer (B) is preferably 0.1 to 30 wt %, more preferably 1 to 15 wt %, or still more preferably 3 to 10 wt % in terms of suppression of the molecular weight of the siloxane polymer and an improvement in the sensitivity at the time of patterning.

Further, the content of trifunctional alkoxysilane compounds with respect to the total amount of the alkoxysilane compounds in the materials of the siloxane polymer (B) is preferably 10 to 60 wt %, more preferably 15 to 50 wt %, or still more preferably 20 to 40 wt % in terms of an increase in the molecular weight of the siloxane polymer and impartment of alkali solubility.

Further, the content of tetrafunctional alkoxysilane compounds with respect to the total amount of the alkoxysilane compounds in the materials of the siloxane polymer (B) is preferably 10 to 60 wt %, more preferably 15 to 50 wt %, or still more preferably 20 to 40 wt % in terms of an increase in the molecular weight of the siloxane polymer and impartment of alkali solubility.

Further, the content of Penta- or more functional alkoxysilane compounds with respect to the total amount of the alkoxysilane compounds in the materials of the siloxane polymer (B) is preferably 0.1 to 50 wt %, more preferably 1 to 40 wt %, or still more preferably 5 to 20 wt % in terms of an increase in the molecular weight of the siloxane polymer and impartment of alkali solubility.

(3) Synthesis Method of Siloxane Polymer (B)

A synthesis method of the siloxane polymer (B) is not particularly limited. It is possible to make the siloxane polymer (B) by subjecting the above-mentioned alkoxysilane compounds to hydrolytic condensation. Water and an acidic or basic catalyst can be used for hydrolysis. Examples of the acidic catalyst include formic acid, acetic acid, trifluoroacetic acid, nitric acid, sulfuric acid, hydrochloric acid, hydrofluoric acid, boric acid, phosphoric acid, and a cation exchange resin. Examples of the basic catalyst include ammonia, triethylamine, monoethanolamine, diethanolamine, triethanolamine, sodium hydroxide, sodium carbonate, sodium hydrogen carbonate, potassium hydroxide, and an anion exchange resin. The usage of the catalyst is not particularly limited, but is preferably 10 to 15 wt % in terms of a monovalent acid or base with respect to the total amount of the alkoxysilane compounds. The catalyst is preferably used as an aqueous solution, and can be used at a concentration of 35 to 45 wt % in terms of a monovalent acid or base. The synthesis reaction temperature is not particularly limited, but usually is in the range of 50° C. to 150° C. The synthesis reaction time is not particularly limited, either, but usually is in the range of 1 to 48 hours. Further, the synthesis can be carried out under any pressure selected from increased pressure, reduced pressure, and atmospheric pressure. After the synthesis, removing components having lower molecular weights by distillation is preferred in order to stabilize the siloxane polymer. The removal by distillation can be performed under any of reduced pressure and normal pressure, and the temperature at which the removal by distillation is performed under normal pressure is usually at about 100° C. to 200° C.

The solvent to be used in the above-mentioned synthesis reaction is preferably one that dissolves the alkoxysilane compounds to be used as materials and products. Examples of the solvent include methanol, ethanol, 1-propanol, 2-propanol, 1-butanol, 2-butanol, isobutanol, tert-butanol, acetone, 2-butanone, ethyl acetate, propyl acetate, tetrahydrofuran, acetonitrile, dioxane, toluene, xylene, cyclohexanone, ethylene glycol monoethyl ether, propylene glycol monomethyl ether, propylene glycol monomethyl ether acetate, diethylene glycol dimethyl ether, diethylene glycol methylethyl ether, methyl 3-methoxypropionate, and ethyl 3-ethoxypropionate. The solvent may be one kind of those, or may be a mixture of two or more kinds of those.

It is preferred that the siloxane polymer (B) have a weight average molecular weight in the range of 500 to 100,000 defined by the GPC analysis using polystyrene as a standard. This is because a developing time required for dissolving an exposed portion in an alkali developer is appropriate and the surface of a film hardly becomes rough at the time of development. In addition, it is more preferred that the weight average molecular weight be in the range of 1,500 to 50,000 because the developing time for dissolving an unexposed portion in an alkali developer is appropriate, the film surface hardly becomes rough at the time of development, and a residue from the development is in an extremely small amount. Further, it is particularly preferred that the weight average molecular weight be in the range of 2,000 to 20,000 because of the same reasons.

The weight average molecular weight of the siloxane polymer (B) can be measured, for example, by using polystyrene having a molecular weight of 645 to 132,900 (for example, a polystyrene calibration kit PL2010-0102 manufactured by VARIAN Inc.) as a standard polystyrene, PLgel MIXED-D (manufactured by VARIAN Inc.) as a column, and THF as a mobile phase. Further, the weight average molecular weight of the siloxane polymer (B) can be adjusted, for example, by controlling the contents and hydrolysis ratios of the difunctional or monofunctional alkoxysilane compounds, and the addition amount of the catalyst.

(3) 1,2-quinone Diazide Compound (C)

For example, any compound used as a photosensitizing agent in a resist field can be employed as the 1,2-quinone diazide compound (C). The 1,2-quinonediazide compound (C) may be used singly, or two or more kinds of those may be used in combination. Examples of the 1,2-quinone diazide compound (C) include an ester of a phenol compound with 1,2-benzoquinone diazide-4-sulfonic acid or 1,2-benzoquinone diazide-5-sulfonic acid, an ester of a phenol compound with 1,2-naphthoquinone diazide-4-sulfonic acid or 1,2-naphthoquinone diazide-5-sulfonic acid, a sulfonamide of a compound in which a hydroxyl group of a phenol compound is replaced by an amino group with 1,2-benzoquinone diazide-4-sulfonic acid or 1,2-benzoquinone diazide-5-sulfonic acid, and a sulfonamide of a compound in which a hydroxyl group of a phenol compound is replaced by an amino group with 1,2-naphthoquinone diazide-4-sulfonic acid or 1,2-naphthoquinone diazide-5-sulfonic acid.

Examples of the phenol compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiinden-5,6,7,5',6',7'-hexanol, and 2,2,4-trimethyl-7,2',4'-trihydroxyflavan.

In terms of an improvement in transparency of the photosensitive composition, it is preferred to use an ester of 2,3,4-trihydroxybenzophenone with 1,2-naphthoquinone diazide-4-sulfonic acid, an ester of 2,3,4-trihydroxybenzophenone with 1,2-naphthoquinone diazide-5-sulfonic acid, an ester of 4,4'-[1-[4-[1-[4-hydroxyphenyl]-1-methylethyl]phenyl]ethylidene]bisphenol with 1,2-naphthoquinone diazide-4-sulfonic acid, or an ester of 4,4'-[1-[4-[1-[4-hydroxyphenyl]-1-methylethyl]phenyl]ethylidene]bisphenol with 1,2-naphthoquinone diazide-5-sulfonic acid as the 1,2-quinone diazide compound (C).

Further, in the photosensitive composition of the present invention, the content of the 1,2-quinone diazide compound (C) is preferably 5 to 50 parts by weight with respect to 100 parts by weight of the siloxane polymer (B).

(4) Solvent (D)

The solvent (D) may be any one that dissolves the above-mentioned components (A) to (C), and one kind of ordinary organic solvents may be used, or two or more thereof may be used in combination. Further, the solvent (D) preferably has a boiling point of 100° C. to 300° C. Examples of the solvent having a boiling point of 100° C. to 300° C. include butyl acetate, butyl propionate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanate, ethyl 2-oxobutanate, dioxane, ethylene glycol, diethylene glycol, triethylene glycol, propylene glycol, dipropylene glycol, tripropylene glycol, 1,4-butanediol, ethylene glycol monoisopropyl ether, ethylene glycol monobutyl ether, propylene glycol monomethyl ether, propylene glycol monomethyl ether acetate, propylene glycol monoethyl ether acetate, propylene glycol monompropyl ether acetate, ethylene glycol monobutyl ether acetate, cyclohexanone, cyclopentanone, diethylene glycol monomethyl ether, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol diethyl ether, diethylene glycol methylethyl ether, toluene, xylene, γ-butyrolactone, and N,N-dimethyl acetamide. Any of those may be used singly, or two or more kinds of those may be used in combination so long as those solvents dissolve the above-mentioned components (A) to (C).

The solvent (D) may be any mixture solvent containing 20 wt % or more of the solvent having a boiling point of 100 to 300° C. One or two or more of known solvents can be used as a solvent except the solvent having a boiling point of 100 to 300° C. in the mixture solvent.

The solvent (D) more preferably includes at least one selected from the group consisting of propylene glycol monomethyl ether, propylene glycol monomethyl ether acetate, propylene glycol monoethyl ether acetate, methyl 3-methoxypropionate, ethyl 3-ethoxypropionate, diethylene glycol monoethyl ether acetate, diethylene glycol monobutyl ether acetate, diethylene glycol dimethyl ether, diethylene glycol methylethyl ether, ethyl lactate, and butyl acetate in terms of an improvement in coating uniformity of the photosensitive composition of the present invention. Further, the solvent (D) still more preferably includes at least one selected from the group consisting of propylene glycol monomethyl ether acetate, methyl 3-methoxypropionate, ethyl 3-ethoxypropionate, diethylene glycol methylethyl ether, ethyl lactate, and butyl acetate in terms of an improvement in coating uniformity of the photosensitive composition of the present invention and in terms of safety to the human body.

The content of the solvent (D) is preferably a content with which the total concentration of the solid content containing the components (A) to (C) reaches 5 to 50 wt % in the photosensitive composition of the present invention.

(5) Other Components

The photosensitive composition of the present invention may further contain components except the above-mentioned components (A) to (D) so long as the effect of the present invention can be obtained. For example, various additives can be added to the photosensitive composition of the present invention in order to improve the resolution, coating uniformity, developing property, and adhesiveness. Examples of the additives include: an acrylic, styrene-, polyethylene imine-, or urethane-based polymer dispersant; an anionic, cationic, nonionic, or fluorine-based surfactant; a silicon-based spreadability improver; an alkali-solubility accelerator such as an organic carboxylic acid or a phenol compound; an antioxidant such as a hindered phenol-based, hindered amine-based, phosphorus-based, or sulfur-based compound; an adhesiveness improver such as a coupling agent; UV absorbers such as alkoxybenzophenones; a cohesion inhibitor such as sodium polyacrylate; and a thermal crosslinking agent such as an epoxy compound, a melamine compound, or a bis-azide compound.

(5-1) Polymer Dispersant, Surfactant, and Spreadability Improver

It is possible to use components used in those applications in a photosensitive composition as the polymer dispersant, the surfactant, and the spreadability improver. One kind of the components may be used, or two or more kinds of them may be used. Examples of the polymer dispersant, the surfactant, and the spreadability improver include Polyflow No. 45, Polyflow-KL-245, Polyflow No. 75, Polyflow No. 90, and Polyflow No. 95 (all of which are trademarks that are manufactured by Kyoeisha Chemical Co., Ltd.), Disperbyk 161, Disperbyk 162, Disperbyk 163, Disperbyk 164, Disperbyk 166, Disperbyk 170, Disperbyk 180, Disperbyk 181, Disperbyk 182, BYK300, BYK306, BYK310, BYK320, BYK330, BYK344, and BYK346 (all of which are trademarks that are manufactured by BYK-Chemic Japan K.K.), KP-341, KP-358, KP-368, KF-96-50CS, and KF-50-100CS (all of which are trademarks that are manufactured by Shin-Etsu Chemical Co., Ltd.), Surflon SC-101 and Surflon KH-40 (both of which are trademarks that are manufactured by AGC Seimi Chemical Co., Ltd.), Ftergent 222F, Ftergent 251, and FTX-218 (all of which are trademarks that are manufactured by Neos Co., Ltd.), EFTOP EF-351, EFTOP EF-352, EFTOP EF-601, EFTOP EF-801, and EFTOP EF-802 (all of which are trademarks that are manufactured by Mitsubishi Materials Corporation), MEGAFAC F-171, MEGAFAC F-177, MEGAFAC F-475, MEGAFAC R-08, and MEGAFAC R-30 (all of which are trademarks that are manufactured by DIC Incorporated), a fluoroalkyl benzenesulfonate, a fluoroalkyl carboxylate, a fluoroalkyl polyoxyethylene ether, a fluoroalkyl ammonium iodide, a fluoroalkyl betaine, a fluoroalkyl sulfonate, a diglycerin tetrakis(fluoroalkylpolyoxyethyleneether), a fluoroalkyl trimethylammonium salt, a fluoroalkyl amino sulfonate, polyoxyethylene nonylphenylether, polyoxyethylene octylphenylether, a polyoxyethylene alkylether, polyoxyethylene laurylether, polyoxyethylene oleylether, polyoxyethylene tridecylether, polyoxyethylene cetylether, polyoxyethylene stearylether, polyoxyethylene laurate, polyoxyethylene olerate, polyoxyethylene stearate, polyoxyethylene laurylamine, sorbitan laurate, sorbitan palmitate, sorbitan stearate, sorbitan oleate, a sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthylether, an alkylbenzene sulfonate salt, and an alkyldiphenylether disulfonate.

Of those, the inclusion into the additive of at least one selected from: fluorine-based surfactants such as the fluoroalkyl benzene sulfonate, the fluoroalkyl carboxylate, the fluoroalkyl polyoxyethylene ether, the fluoroalkyl ammonium iodide, the fluoroalkyl betaine, the fluoroalkyl sulfonate, the diglycerol tetrakis(fluoroalkylpolyoxyethyleneether), the fluoroalkyl trimethyl ammonium salt, and the fluoroalkyl aminosulfonate; and silicon-based spreadability improvers such as BYK306, BYK344, BYK346, KP-341, KP-358, and KP-368 is preferred in terms of an improvement in coating uniformity of the photosensitive composition of the present invention.

Each of the contents of the polymer dispersant, surfactant, and spreadability improver in the photosensitive composition of the present invention is preferably 0.001 to 0.1 part by weight with respect to 100 parts by weight of the total amount of the composition.

(5-2) Organic Carboxylic Acid

Organic carboxylic acids can be used as the alkali-solubility accelerator. One kind of the organic carboxylic acids may be used, or two or more kinds of them may be used. Polyvalent carboxylic acids are preferred as the organic carboxylic acids. Examples of the polyvalent carboxylic acids include trimellitic anhydride, phthalic anhydride, and 4-methylcyclohexane-1,2-dicarboxylic anhydride. Of those polyvalent carboxylic acids, trimellitic anhydride is preferred.

When a polyvalent carboxylic acid is added to the photosensitive composition of the present invention, the alkali solubility of the photosensitive composition can be enhanced.

Further, when the photosensitive composition includes epoxy groups, carboxyl groups of the polyvalent carboxylic acid react with the epoxy groups, and hence the thermal resistance and chemical resistance can be further improved. Further, when the polyvalent carboxylic acid is added to the photosensitive composition of the present invention, the decomposition of the 1,2-quinone diazide compound (B) is suppressed upon storage of the photosensitive composition. Thus, the addition of the polyvalent carboxylic acid is preferred in terms of the prevention of the coloring of the photosensitive composition.

The content of the organic carboxylic acids in the photosensitive composition of the present invention is preferably 1 to 30 parts by weight, or more preferably 2 to 20 parts by weight, with respect to 100 parts by weight of the siloxane polymer (B).

(5-3) Phenol Compound

Phenol compounds can each be used as the alkali-solubility accelerator. One kind of the phenol compounds may be used, or two or more kinds of them may be used. Examples of the phenol compounds include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3-tetramethyl-1,1'-spirobiinden-5,6,7,5',6',7'-hexanol, and 2,2,4-trimethyl-7,2',4'-trihydroxyflavan. Of those phenol compounds, 4,4'-[1-[4-[1-[4-hydroxyphenyl]-1-methylethyl]phenyl]ethylidene]bisphenol is preferred.

When a phenol compound is added to the photosensitive composition of the present invention, the alkali solubility of the photosensitive composition can be enhanced. Further, when the photosensitive composition includes epoxy groups, a phenol group of the phenol compound reacts with the epoxy groups, and hence the thermal resistance and chemical resistance can be further improved.

The content of the phenol compound in the photosensitive composition of the present invention is preferably 1 to 50 parts by weight, or more preferably 5 to 20 parts by weight with respect to 100 parts by weight of the siloxane polymer (B).

(5-4) Antioxidant

It is possible to suitably use any one of antioxidants of a hindered phenol-based compound, hindered amine-based compound, phosphorus-based compound, and sulfur-based compound as the antioxidant. One kind of the antioxidants may be used, or two or more kinds of them may be used. The antioxidant of the hindered phenol-based compound is preferred as the antioxidant in terms of the weather resistance. Examples of the antioxidants include: Irganox1010, Irganox1010FF, Irganox1035, Irganox1035FF, Irganox1076, Irganox1076FD, Irganox1076DWJ, Irganox1096, Irganox1135, Irganox1330, Irganox1726, Irganox1425 WL, Irganox1520L, Irganox245, Irganox245FF, Irganox245DWJ, Irganox259, Irganox3114, Irganox565, Irganox565DD, and Irganox295 (trade names; manufactured by Ciba Japan K.K.); ADK STAB AO-20, ADK STAB AO-30, ADK STAB AO-50, ADK STAB AO-60, ADK STAB AO-70, and ADK STAB AO-80 (trade names; manufactured by ADEKA Co., Ltd.). Of those, Irganox1010 is more preferred.

The content of the antioxidant in the photosensitive composition of the present invention is preferably 0.1 to 15 parts by weight, or more preferably 1 to 10 parts by weight with respect to 100 parts by weight of the siloxane polymer (B).

(5-5) Adhesiveness Improver

The adhesiveness improver is used for improving the adhesiveness between the photosensitive composition and a substrate. A coupling agent can be suitably used as the adhesiveness improver. One kind of adhesiveness improvers may be used, or two or more kinds of them may be used. It is possible to use a silane-based compound, an aluminum-based compound, or a titanate-based compound as the coupling agent. Examples of the coupling agents include 3-glycidoxypropyldimethylethoxy silane, 3-glycidoxypropylmethyldiethoxy silane, 3-glycidoxypropyltrimethoxy silane, acetoalkoxy aluminum diisopropylate, and tetraisopropyl bis(dioctylphosphite) titanate. Of those, 3-glycidoxypropyltrimethoxysilane is preferred because of its great improving effect on adhesiveness.

The content of the adhesiveness improver in the photosensitive composition of the present invention is preferably 10 parts by weight or less with respect to 100 parts by weight of the siloxane polymer (B).

It is possible to use one of the components such as alkoxybenzophenones, which are used as UV absorbers in a photosensitive composition as the UV absorber. One kind of UV absorbers may be used, or two or more kinds of them may be used. Examples of the UV absorber include TINUVIN P, TINUVIN 120, TINUVIN 144, TINUVIN 213, TINUVIN 234, TINUVIN 326, TINUVIN 571, and TINUVIN 765 (all of which are trademarks and manufactured by Ciba Japan K.K.).

The content of the UV absorber in the photosensitive composition of the present invention is preferably 0.01 to 10 parts by weight, or more preferably 0.1 to 5 parts by weight with respect to 100 parts by weight of the siloxane polymer (B).

It is possible to use a component that induces a crosslinking reaction in film formation using a photosensitive composition as a material under a heating condition as the thermal crosslinking agent. One kind of thermal crosslinking agents may be used, or two or more kinds of them may be used. A thermal crosslinking agent such as an epoxy compound may be used as the thermal crosslinking agent, and examples thereof include: jER 807, jER 815, jER 825, jER 827, jER 828, jER 190P, jER 191P, jER 1004, jER 1256, and YX8000 (trade names; manufactured by Mitsubishi Chemical Co., Ltd.); Araldite CY 177 and Araldite CY 184 (trade names; manufactured by Ciba Japan K.K.); Celoxide 2021P and EHPE-3150 (trade names; manufactured by Daicel Chemical Industries, Ltd.); and TECHMORE VG3101L (trade name; manufactured by Printec Ltd.)).

The content of the thermal crosslinking agent in the photosensitive composition of the present invention is preferably 1 to 30 parts by weight, or more preferably 5 to 15 parts by weight with respect to 100 parts by weight of the siloxane polymer (B).

Storing the photosensitive composition of the present invention while shielding from light in the temperature range of −30° C. to 25° C. is preferred in terms of the time-dependent stability of the photosensitive composition. The storing temperature is more preferably −20° C. to 10° C. in terms of the prevention of the generation of precipitates from the photosensitive composition.

The photosensitive composition of the present invention is suitable for forming a transparent film, and is optimal for forming an insulating film with small pores each having a diameter of 10 μm or less because the resolution is relatively high at the time of patterning. Here, the term "insulating film" refers to, for example, a film (interlayer insulating film) provided for insulation between the wirings arranged in layers.

The patterned transparent film of the present invention is formed by subjecting a coated film of the above-mentioned photosensitive composition of the present invention to exposure, development, and baking. For example, the patterned transparent film of the present invention such as the transparent film or insulating film can be formed by using a usual method of forming a film in the resist field. For example, film formation is performed as described below.

First, the photosensitive composition of the present invention is applied on a substrate made of glass or the like by conventionally known method such as spin coating, roll coating, or slit coating. Examples of the substrate include: transparent glass substrates such as a white glass plate, a blue glass plate, and a silica-coated blue glass plate; synthetic resin sheets, films, or substrate such as those made of polycarbonate, polyether sulfone, polyester, acrylic, vinyl chloride, an aromatic polyamide, polyamide imide, and polyimide; metal substrates such as an aluminum plate, a copper plate, a nickel plate, and a stainless steel plate; other ceramic plates; and semiconductor substrates having opto-electric conversion elements. Those substrates may be subjected to any preprocessing such as a chemical treatment with a silane coupling agent or the like, a plasma treatment, ion plating, sputtering, chemical vapor deposition, and vacuum deposition.

Next, the coated film of the photosensitive composition on the substrate is dried with a hot plate or an oven. The drying is usually performed at 60 to 120° C. for 1 to 5 minutes. The dried coating film on the substrate is irradiated with radiation such as a UV-ray through a mask having opening sections with a desired pattern form. Because the photosensitizing agent in the photosensitive composition is the 1,2-quinone diazide compound (B), the irradiation is suitably carried out by i-ray at 5 to 1,000 mJ/cm$^2$. The 1,2-quinone diazide compound (B) located on the UV-irradiated portion is converted into indene carboxylic acid to be quickly dissolved in a developing solution.

The film irradiated with radiation may be developed using a developing solution such as an alkali solution. The development allows the portion irradiated with the radiation in the film to be quickly dissolved in the developing solution. A developing method is not particularly limited, and any one of dip development, paddle development, and shower development can be employed.

The above-mentioned developing solution is preferably an alkali solution. Examples of the alkali in the alkali solution include tetramethylammonium hydroxide, tetraethylammonium hydroxide, 2-hydroxyethyl trimethylammonium hydroxide, sodium carbonate, sodium hydrogen carbonate, potassium carbonate, potassium hydrogen carbonate, sodium hydroxide, and potassium hydroxide. In addition, an aqueous solution of any of those alkalis is suitably used as a developing solution. In other words, examples of the developing solution include aqueous solutions of: organic alkalis such as tetramethylammonium hydroxide, tetraethylammonium hydroxide, and 2-hydroxyethyl trimethylammonium hydroxide; and inorganic alkalis such as sodium carbonate, sodium hydroxide, and potassium hydroxide.

The developing solution may be added with methanol, ethanol, or a surfactant for a reduction in developing residue and a suitable pattern formation. For example, one selected from anionic, cationic, and nonionic surfactants may be used as the surfactant. Of those, in particular, a nonionic polyoxyethylene alkyl ether is preferably added in terms of an improvement in resolution.

The film that has undergone the development is rinsed with pure water sufficiently. After that, the whole surface of the film on the substrate can be irradiated again with radiation for the purpose of decomposing a residual photosensitizing agent. When the radiation is a UV-ray, for example, the irradiation thereof at an intensity of 100 to 1,000 mJ/cm$^2$ is carried out. The film irradiated again with the radiation on the substrate is finally baked at 300 to 350° C. for 10 to 120 minutes. Thus, a transparent film on which a desired pattern is formed can be obtained.

The patterned transparent film thus obtained may be used as a patterned insulating film. The hole formed in the insulating film is preferably in the shape of a square, a rectangle, a circle, or an oval when viewed directly from above. Further, a transparent electrode may be formed on the insulating film and the patterning may be then performed by etching, followed by the formation of a film to be subjected to orientation-processing. The insulating film has high sputtering resistance, and hence the appearance of wrinkles does not occur on the insulating film even after the formation of the transparent electrode, and high transparency can be thus retained.

The patterned transparent film of the present invention can be formed so as to have a usual thickness suitable for a desired application in a display device such as a liquid crystal display device. The patterned transparent film of the present invention preferably has a thickness of 2 μm or less in terms of the sufficient expression of crack resistance, and preferably has a thickness of 1 μm or more in terms of the realization of the desired application. The thickness of the patterned transparent film can be adjusted by controlling the viscosity of the photosensitive composition of the present invention and the concentration of the solid content in the photosensitive composition of the present invention.

The patterned transparent film of the present invention is baked at high temperatures of 300° C. or more as described above, and hence, when the film is exposed to the conditions in various steps of producing a display device, changes in the physical properties of the film are suppressed. In addition, by using the patterned transparent film of the present invention, it is possible to obtain, as an inorganic film baked at the high temperatures as described above, a film having high transparency and high crack resistance, the film having a thickness enough for being able to be used in usual applications in a display device.

The patterned transparent film of the present invention is used in a display device using liquid crystal and the like. For example, the display device can be produced as described below. A device substrate on which the patterned transparent film of the present invention is provided as described above and a color filter substrate provided as an opposite substrate are aligned and pressure-bonded, followed by subjecting to a thermal treatment and combining together. Subsequently, the liquid crystal is injected into the space between the opposite substrates, followed by sealing an inlet.

Alternatively, production can be performed by layering the device substrates together after dispersing the liquid crystal on the device substrate and then sealing the gap between the opposite substrates to prevent the leakage of the liquid crystal, and the display device may be one thus produced.

Consequently, the insulating film having excellent thermal resistance and excellent transparency, which is formed of the photosensitive composition of the present invention, can be used in the liquid crystal display device. Note that the liquid crystal to be used in the display device of the present invention, that is the liquid crystal compound and the liquid crystal composition are not particularly limited, and any of liquid crystal compounds and liquid crystal compositions can be used.

The photosensitive composition according to a preferred mode of the present invention additionally has, for example, various characteristics generally requested for a transparent film on which a pattern is formed and an insulating film such as high solvent resistance, high water resistance, high acid resistance, high alkali resistance, high thermal resistance, high transparency, and adhesiveness with a ground.

The photosensitive composition according to the preferred mode of the present invention is excellent in solvent resistance, acid resistance, alkali resistance, thermal resistance, and transparency. Thus, even when a transparent film, insulating film, display device, and the like each using the photosensitive composition are exposed to high temperatures of 300 to 350° C. in the post-production processes, or even when the transparent film, insulating film, display device, and the like are subjected, for example, to immersion and contact with a solvent, an acidic solution, an alkali solution, or the like and to a thermal treatment, surface roughness is rarely generated on the films. As a result, the optical transmittance is increased in the transparent film and the like each using the photosensitive composition according to the preferred mode of the present invention, and hence the display quality of a product such as a display device using the film can be enhanced.

EXAMPLES

Hereinafter, the present invention is described more specifically by way of examples. However, the present invention is not limited by these examples.

Synthesis Example 1

Synthesis of Copolymer (B1)

A copolymer (B1) corresponding to the siloxane polymer (B) was synthesized in the following manner.

Loaded into a four-necked flask equipped with a stirrer were diethylene glycol ethyl methyl ether as a polymerization solvent, and tetraethoxysilane, dimethyldiethoxysilane, and phenyltriethoxysilane as monomers in the following weights, and a mixed solution of 10.3 g of formic acid and 16.0 g of water was added by dripping. After that, the mixture was heated at 80° C. for 1 hour, then subjected to distillation for 1 hour to remove low-molecular-weight components, and further subjected to distillation at 130° C. for 2 hours, to yield a polymer solution. The total amount of low-boiling-point components removed by the distillation was 76.3 g.

| | |
|---|---|
| Diethylene glycol ethyl methyl ether | 100.0 g |
| Tetraethyl orthosilicate | 34.8 g |
| Diethoxydimethylsilane | 12.3 g |
| Phenyltriethoxysilane | 40.0 g |

The polymer solution was cooled to room temperature to yield a copolymer (B1) solution. Part of the solution was sampled, and the weight average molecular weight of the copolymer was measured by GPC analysis (polystyrene standard). The weight average molecular weight of the copolymer (B1) was measured by using a differential refractive index detector, in which polystyrene having a molecular weight of 645 to 132,900 (a polystyrene calibration kit PL2010-0102 manufactured by VARIAN Inc.) was used as a standard polystyrene, PLgel MIXED-D (manufactured by VARIAN Inc.) was used as a column, THF was used as a mobile phase, and a column temperature was set at 35° C. As a result, the weight average molecular weight was 5,100.

Synthesis Example 2

Synthesis of Copolymer (B2)

The following components were loaded in the following weights in the same manner as that in Synthesis Example 1 except that a mixed solution of 10.3 g of formic acid and 14.6 g of water was dripped, to thereby perform polymerization. The same treatment as that in Synthesis Example 1 was conducted to yield a polymer solution. The total amount of low-boiling-point components removed by the distillation was 72.3 g.

| | |
|---|---|
| Diethylene glycol ethyl methy ether | 100.0 g |
| Tetraethyl orthosilicate | 34.8 g |
| Ethoxytrimethylsilane | 6.0 g |
| Phenyltriethoxysilane | 40.0 g |

Further, the polymer solution was cooled to room temperature to yield a copolymer (B2) solution. The resultant copolymer (B2) solution was subjected to GPC analysis (polystyrene standard). As a result, the weight average molecular weight was determined to be 4,200.

Synthesis Example 3

Synthesis of Copolymer (B3)

The following components were loaded in the following weights in the same manner as that in Synthesis Example 1 except that a mixed solution of 9.6 g of formic acid and 15.0 g of water was dripped, to thereby perform polymerization. The same treatment as that in Synthesis Example 1 was conducted to yield a polymer solution. The total amount of low-boiling-point components removed by the distillation was 72.4 g.

| | |
|---|---|
| Diethylene glycol ethyl methyl ether | 100.0 g |
| Tetraethyl orthosilicate | 34.8 g |
| Diethoxydimethylsilane | 6.2 g |
| Phenyltriethoxysilane | 40.0 g |

Further, the polymer solution was cooled to room temperature to yield a copolymer (B3) solution. The resultant copolymer (B3) solution was subjected to GPC analysis (polystyrene standard). As a result, the weight average molecular weight was determined to be 4,200.

Synthesis Example 4

Synthesis of Copolymer (B4)

The following components were loaded in the following weights in the same manner as that in Synthesis Example 1 except that a mixed solution of 9.9 g of formic acid and 14.6 g of water was dripped, to thereby perform polymerization. The same treatment as that in Synthesis Example 1 was conducted to yield a polymer solution. The total amount of low-boiling-point components removed by the distillation was 73.6 g.

| | |
|---|---|
| Diethylene glycol ethyl methyl ether | 100.0 g |
| Cyclohexyldimethoxymethylsilane | 9.4 g |
| Tetraethyl orthosilicate | 34.8 g |
| Phenyltriethoxysilane | 40.0 g |

Further, the polymer solution was cooled to room temperature to yield a copolymer (B4) solution. The resultant copolymer (B4) solution was subjected to GPC analysis (polystyrene standard). As a result, the weight average molecular weight was determined to be 5,200.

Synthesis Example 5

Synthesis of Copolymer (B5)

The following components were loaded in the following weights in the same manner as that in Synthesis Example 1 except that a mixed solution of 7.4 g of formic acid and 18.7 g of water was dripped, to thereby perform polymerization. The same treatment as that in Synthesis Example 1 was conducted to yield a polymer solution. The total amount of low-boiling-point components removed by the distillation was 63.6 g.

| | |
|---|---|
| Diethylene glycol ethyl methyl ether | 100.0 g |
| Tetraethyl orthosilicate | 40.0 g |
| Triethoxyvinylsilane | 15.2 g |
| Diethoxydiphenylsilane | 3.3 g |

Further, the polymer solution was cooled to room temperature to yield a copolymer (B5) solution. The resultant copolymer (B5) solution was subjected to GPC analysis (polystyrene standard). As a result, the weight average molecular weight was determined to be 4,000.

Synthesis Example 6

Synthesis of Copolymer (B6)

The following components were loaded in the following weights in the same manner as that in Synthesis Example 1 except that a mixed solution of 7.7 g of formic acid and 11.2 g of water was dripped, to thereby perform polymerization. The same treatment as that in Synthesis Example 1 was conducted to yield a polymer solution. The total amount of low-boiling-point components removed by the distillation was 63.3 g.

| | |
|---|---|
| Diethylene glycol ethyl methyl ether | 100.0 g |
| Tetraethyl orthosilicate | 21.6 g |
| Triethoxyvinylsilane | 7.8 g |
| Triethoxysilane | 6.8 g |
| Phenyltriethoxysilane | 20.0 g |
| Ethoxytrimethylsilane | 2.0 g |

Further, the polymer solution was cooled to room temperature to yield a copolymer (B6) solution. The resultant copolymer (B6) solution was subjected to GPC analysis (polystyrene standard). As a result, the weight average molecular weight was determined to be 6,000.

Synthesis Example 7

Synthesis of Copolymer (B7)

The following components were loaded in the following weights in the same manner as that in Synthesis Example 1 except that a mixed solution of 9.6 g of formic acid and 12.1 g of water was dripped, to thereby perform polymerization. The same treatment as that in Synthesis Example 1 was conducted to yield a polymer solution. The total amount of low-boiling-point components removed by the distillation was 69.6 g.

| | |
|---|---|
| Diethylene glycol ethyl methyl ether | 100.0 g |
| Tris(3-(trimethoxysilyl) propyl) isocyanurate | 15.2 g |
| Triethoxyvinylsilane | 8.0 g |
| Triethoxysilane | 6.8 g |
| Phenyltriethoxysilane | 40.0 g |
| Ethoxytrimethylsilane | 4.0 g |

Further, the polymer solution was cooled to room temperature to yield a copolymer (B7) solution. The resultant copolymer (B7) solution was subjected to GPC analysis (polystyrene standard). As a result, the weight average molecular weight was determined to be 6,300.

Example 1

Production of Positive Photosensitive Composition

A positive photosensitive composition was obtained by mixing and dissolving diethylene glycol ethyl methyl ether as a solvent, the following compound (A1), the copolymer (B1) solution obtained in Synthesis Example 1, a condensed product as a 1,2-quinone diazide compound of 4,4'-[1-[4-[1-[4-hydroxyphenyl]-1-methylethyl]phenyl]ethylidene]bisphenol and 1,2-naphthoquinone diazide-5-sulfonic chloride (an average esterification rate of 58%, hereinafter referred to as "PAD"), and a fluorine-based surfactant, MEGAFAC R-08, manufactured by DIC Incorporated (hereinafter, abbreviated as "R-08") as an additive, in the following weights.

| | |
|---|---|
| Diethylene glycol ethyl methyl ether | 0.66 g |
| Compound (A1) | 0.1 g |
| Copolymer (B1)solution | 2.00 g |
| PAD | 0.1 g |
| R-08 | 0.0008 g |

Here, the compound (A1) is a compound represented by the general formula (I) in which all R's represent phenyl groups and all X's represent —Si(CH$_3$)$_2$H's, and the compound can be easily synthesized according to the method described in WO 04/024741 A1.

[Method of Evaluating Positive Photosensitive Composition]
(1) Formation of Patterned Transparent Film The positive photosensitive composition synthesized in Example 1 was spin-coated on a glass substrate at 500 rpm for 10 seconds and then dried on a hot plate at 100° C. for 2 minutes. The substrate was exposed with an exposure gap of 100 μm through a mask for hole-pattern formation in the air using the Proximity Exposure System TME-150 PRC (using a super-high pressure mercury lamp as a light source) manufactured by Topcon Co., Ltd., with g, h, and i rays taken out by cutting rays of 350 nm or less through a wavelength cut filter. The amount of light exposure was measured using a totalizing actinometer UIT-102 and a photometer UVD-365 PD manufactured by Ushio Inc., resulting in 100 mJ/cm$^2$. The glass substrate after the exposure was developed by dipping in an aqueous solution of tetramethylammonium hydroxide for 60 seconds, thereby removing a composition from the exposed portion. The substrate after the development was washed with pure water for 60 seconds and then dried on a hot plate at 100° C. for 2 minutes. The whole surface of the substrate was exposed in the exposure system at a light exposure of 300 mJ/cm$^2$ without the use of any mask and then post-baked in an oven at 300° C. for 30 minutes, thereby forming a patterned transparent film with a film thickness of about 1.5 μm. The film thickness was measured as an average of film thicknesses measured at three different points using a probe-type thickness tester α-Step 200 manufactured by KLA-Tencor Japan Co., Ltd.

(2) Film Thickness after Development and Residual Film Rate after Development

The film thicknesses were measured before and after the development. A residual film rate after development was calculated from the following equation.

(Film thickness after development/film thickness before development)×100(%)

(3) Resolution

The substrate of the patterned transparent film after post-baking obtained in the above item (1) was observed with an optical microscope at a magnification of 1,000. As a result, a mask size where the glass was exposed on the bottom of the hole pattern was observed.

(4) Transparency

A TC-1800 manufactured by Tokyo Denshoku Co. Ltd. was used for the measurement of an optical transmittance at a wavelength of 400 nm with a glass substrate where no transparent film was formed as a reference.

(5) Thermal Resistance

The substrate of the patterned transparent film obtained in the above item (1) was further baked in the oven at 350° C. for 30 minutes, and the optical transmittances thereof were then measured in a manner similar to the above item (4) before and after the baking. The optical transmittance after the post-baking (before the additional baking) was defined as T1 and the optical transmittance after the additional baking was defined as T2. It can be judged that, the lower the extent to which the optical transmittance after the additional baking decreases compared with the optical transmittance after the post-baking, the better. In addition, the film thicknesses were measured before and after the additional baking. Then, the change rate of the film thickness was calculated from the following equation.

(Film thickness after additional baking/film thickness after post-baking)×100(%)

(6) Adhesiveness

The substrate of the patterned transparent film obtained in the above item (1) was evaluated by a crosscut peeling test (crosscut test). The results of the evaluation were expressed by the number of the remaining grids after tape-peeling among 100 grids (1-mm square).

(7) Relative Dielectric Constant

Electrodes were produced above and below the transparent film, and the relative dielectric constant of the resultant was measured with an LCR meter (4284A) manufactured by Agilent Technologies. The evaluation was performed at 1 kHz.

(8) Crack Resistance

The substrate after the post-baking obtained in the above item (1) and the substrate obtained after the additional baking in the oven at 350° C. for 30 minutes were observed with an optical microscope at a magnification of 1000 so that the presence or absence of cracks in the films might be observed. The symbol "○" refers to the case where cracks are not generated both after the post-baking and after the additional baking. The symbol "X" refers to the case where cracks are not generated after the post-baking, but cracks are generated after the additional baking. The symbol "XX" refers to the case where cracks have already been generated after the post-baking.

With respect to the positive photosensitive composition synthesized in Example 1, the results obtained by the above-mentioned evaluation method are shown in Table 1.

TABLE 1

|  | Example 1 | Example 2 | Example 3 | Example 4 | Example 5 | Example 6 | Example 7 | Example 8 |
|---|---|---|---|---|---|---|---|---|
| Film thickness after development (μm) | 1.64 | 1.56 | 1.89 | 1.70 | 1.63 | 1.65 | 1.76 | 1.60 |
| Residual film rate after development (%) | 98.1 | 99.0 | 97.2 | 98.2 | 97.7 | 98.0 | 97.8 | 96.6 |
| Resolution (μm) | 7 | 7 | 7 | 7 | 7 | 7 | 7 | 7 |
| Film thickness after post-baking (μm) | 1.54 | 1.48 | 1.58 | 1.60 | 1.53 | 1.55 | 1.65 | 1.48 |
| Optical transmittance T1 (%) | 98.8 | 98.5 | 98.3 | 96.4 | 98.2 | 98.8 | 96.5 | 98.3 |
| Optical transmittance T2 (%) | 96.2 | 95.8 | 96.1 | 92.3 | 94.5 | 95.6 | 92.2 | 94.5 |
| Film thickness after additional baking (μm) | 1.53 | 1.47 | 1.57 | 1.56 | 1.52 | 1.54 | 1.60 | 1.47 |
| Thermal resistance (change rate of film thickness) (%) | 99.4 | 99.3 | 99.4 | 97.5 | 99.3 | 99.4 | 97.0 | 99.3 |
| Adhesiveness | 100 | 100 | 100 | 100 | 100 | 100 | 100 | 100 |
| Relative dielectric constant | 3.1 | 3.2 | 3.1 | 3.0 | 3.2 | 3.2 | 3.3 |  |
| Crack resistance | ○ | ○ | ○ | ○ | ○ | ○ | ○ | ○ |

Example 2

A positive photosensitive composition was prepared in the same manner as that in Example 1 except that the copolymer (B2) solution obtained in Synthesis Example 2 was used in place of the copolymer (B1) solution used in Example 1. Then, the positive photosensitive composition was evaluated in the same manner as that in Example 1. Table 1 shows the results.

Example 3

A positive photosensitive composition was prepared in the same manner as that in Example 1 except that the copolymer (B3) solution obtained in Synthesis Example 3 was used in place of the copolymer (B1) solution used in Example 1. Then, the positive photosensitive composition was evaluated in the same manner as that in Example 1. Table 1 shows the results.

Example 4

A positive photosensitive composition was prepared in the same manner as that in Example 1 except that the copolymer (B4) solution obtained in Synthesis Example 4 was used in place of the copolymer (B1) solution used in Example 1. Then, the positive photosensitive composition was evaluated in the same manner as that in Example 1. Table 1 shows the results.

Example 5

A positive photosensitive composition was prepared in the same manner as that in Example 1 except that the copolymer (B5) solution obtained in Synthesis Example 5 was used in place of the copolymer (B1) solution used in Example 1. Then, the positive photosensitive composition was evaluated in the same manner as that in Example 1. Table 1 shows the results.

Example 6

A positive photosensitive composition was prepared in the same manner as that in Example 1 except that the copolymer (B6) solution obtained in Synthesis Example 6 was used in place of the copolymer (B1) solution used in Example 1. Then, the positive photosensitive composition was evaluated in the same manner as that in Example 1. Table 1 shows the results.

Example 7

A positive photosensitive composition was prepared in the same manner as that in Example 1 except that the copolymer (B7) solution obtained in Synthesis Example 7 was used in place of the copolymer (B1) solution used in Example 1. Then, the positive photosensitive composition was evaluated in the same manner as that in Example 1. Table 1 shows the results.

Example 8

A positive photosensitive composition was prepared in the same manner as that in Example 1 except that the following compound (A2) was used in place of the compound (A1) used in Example 1. Then, the positive photosensitive composition was evaluated in the same manner as that in Example 1. Table 1 shows the results. Here, the compound (A2) is a compound represented by the general formula (I) in which all R's represent phenyl groups and all X's each represent hydrogen, and the compound can be easily synthesized according to the method described in JP 2006-182650 A.

Comparative Example 1

A positive photosensitive composition was prepared in the same manner as that in Example 1 except that the compound (A1) was not used. Then, the positive photosensitive composition was evaluated in the same manner as that in Example 1. Table 2 shows the results.

TABLE 2

|  | Comparative Example 1 | Comparative Example 2 | Comparative Example 3 |
|---|---|---|---|
| Film thickness after development (μm) | 1.61 | 1.59 | 1.80 |
| Residual film rate after development (%) | 82.0 | 83.6 | 85.3 |
| Resolution (μm) | 7 | 7 | 7 |
| Film thickness after post-baking μm | Unmeasurable (crack) | Unmeasurable (crack) | 1.46 |
| Optical transmittance T1 (%) | 98.4 | 96.2 | 96.3 |
| Optical transmittance T2 (%) | Unmeasurable (large crack) | Unmeasurable (large crack) | Unmeasurable (large crack) |
| Film thickness after additional baking (μm) | Unmeasurable (large crack) | Unmeasurable (large crack) | Unmeasurable (large crack) |
| Thermal resistance (change rate of film thickness) (%) | Unmeasurable (large crack) | Unmeasurable (large crack) | Unmeasurable (large crack) |
| Adhesiveness | Unmeasurable (large crack) | Unmeasurable (large crack) | Unmeasurable (large crack) |
| Relative dielectric constant | Unmeasurable (large crack) | Unmeasurable (large crack) | Unmeasurable (large crack) |
| Crack resistance | x x | x x | x |

Comparative Example 2

A positive photosensitive composition was prepared in the same manner as that in Example 4 except that the compound (A1) was not used. Then, the positive photosensitive composition was evaluated in the same manner as that in Example 4. Table 2 shows the results.

Comparative Example 3

A positive photosensitive composition was prepared in the same manner as that in Example 7 except that the compound (A1) was not used. Then, the positive photosensitive composition was evaluated in the same manner as that in Example 7. Table 2 shows the results.

INDUSTRIAL APPLICABILITY

The photosensitive composition of the present invention can be used in, for example, a liquid crystal display device.

The invention claimed is:

1. A photosensitive composition, comprising:
a compound (A) represented by the following general formula (I);
a siloxane polymer (B), which has alkali solubility and is synthesized by hydrolytic condensation of materials including two or more kinds of alkoxysilane compounds having different numbers of alkoxyl groups;
a 1,2-quinone diazide compound (C); and
a solvent (D) for dissolving the above-mentioned (A) to (C):

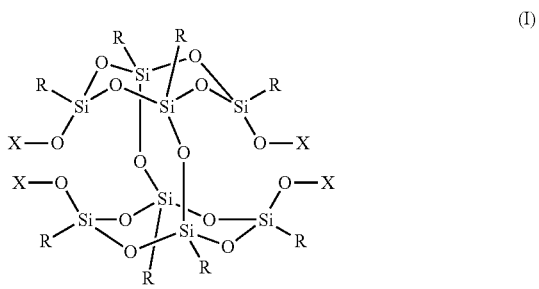

(I)

wherein the alkoxysilane compounds include di-, tri- and tetra-functional alkoxysilane compounds,
where:
R's independently represent hydrogen, an alkyl group having 1 to 45 carbon atoms, a cycloalkyl group having 4 to 8 carbon atoms, or a substituted or unsubstituted aryl group having 6 to 10 carbon atoms;
X's independently represent hydrogen, $-Si(CH_3)_2H$, $-Si(CH_3)_3$, $-Si(CH_3)_2(CH_2)_3-OOCC(CH_3)=CH_2$, $-Si(CH_3)_2(CH_2)_3COOH$, or a group represented by the following formula (II);

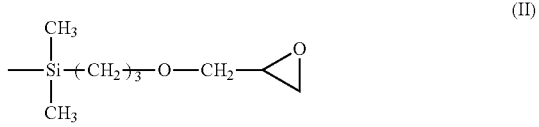

(II)

in each of the alkyl group having 1 to 45 carbon atoms represented by R and the cycloalkyl group having 4 to 8 carbon atoms represented by R, any hydrogen may be replaced by fluorine, and any $-CH_2-$ may be replaced by $-O-$ or a cycloalkylene group having 5 to 18 carbon atoms so long as the $-CH_2-$ is unadjacent to another $-CH_2-$; and
in a benzene ring of the substituted aryl group represented by R, any hydrogen bonded to the benzene ring may be independently replaced by an alkyl group having 1 to 10 carbon atoms or a halogen.

2. The photosensitive composition according to claim 1, wherein the compound (A) represented by the general formula (I) is contained at a ratio of 1 to 50 parts by weight with respect to 100 parts by weight of the siloxane polymer (B).

3. The photosensitive composition according to claim 1, wherein the siloxane polymer (B) has a weight average molecular weight of 500 to 100,000 in terms of polystyrene.

4. The photosensitive composition according to claim 2, wherein the siloxane polymer (B) has a weight average molecular weight of 500 to 100,000 in terms of polystyrene.

5. A patterned transparent film, which is formed by exposure to light, development, and baking of a coated film of the photosensitive composition according to any one of claims 1 to 4.

6. A display device comprising the patterned transparent film according to claim 5.

7. The display device according to claim 6, comprising the patterned transparent film as an insulating film.

* * * * *